(12) United States Patent
Kang et al.

(10) Patent No.: US 9,035,330 B2
(45) Date of Patent: May 19, 2015

(54) ORGANIC LIGHT-EMITTING DISPLAY DEVICE AND METHOD OF MANUFACTURING THE ORGANIC LIGHT EMITTING DISPLAY DEVICE

(75) Inventors: Jin-Goo Kang, Yongin (KR); Mu-Hyun Kim, Yongin (KR); Jae-Bok Kim, Yongin (KR); Dong-Kyu Lee, Yongin (KR); Ji-Young Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 712 days.

(21) Appl. No.: 13/088,261

(22) Filed: Apr. 15, 2011

(65) Prior Publication Data

US 2011/0272715 A1 Nov. 10, 2011

(30) Foreign Application Priority Data

May 7, 2010 (KR) .................... 10-2010-0043054

(51) Int. Cl.
  *H01L 33/00* (2010.01)
  *H01L 29/04* (2006.01)
  *H01L 31/036* (2006.01)
  *H01L 27/32* (2006.01)
  *H01L 51/52* (2006.01)

(52) U.S. Cl.
  CPC .......... *H01L 27/3246* (2013.01); *H01L 51/5237* (2013.01)

(58) Field of Classification Search
  CPC ............ H01L 27/3246; H01L 27/3258; H01L 21/31116; H01L 21/32135
  USPC ............ 257/72, 59, 40, 83, 88, 100, E33.062; 313/504, 506; 438/34, 151
  See application file for complete search history.

(56) References Cited

U.S. PATENT DOCUMENTS

| | | | | |
|---|---|---|---|---|
| 2003/0094615 | A1* | 5/2003 | Yamazaki et al. | ............... 257/72 |
| 2004/0079937 | A1* | 4/2004 | Miyazawa | ...................... 257/10 |

(Continued)

FOREIGN PATENT DOCUMENTS

| | | |
|---|---|---|
| JP | 2005-026103 | 1/2005 |
| JP | 2005347275 | 12/2005 |

(Continued)

OTHER PUBLICATIONS

Office Action dated Sep. 30, 2011 in Korean Priority Application No. 10-2010-0043054.

(Continued)

*Primary Examiner* — Shouxiang Hu
(74) *Attorney, Agent, or Firm* — Knobbe Martens Olson & Bear LLP (57) ABSTRACT

An organic light-emitting display device and a method of manufacturing the same are disclosed. The organic light-emitting display device includes: a substrate, a plurality of pixels on the substrate, a plurality of first electrodes, each disposed in each of the plurality of pixels, a pixel defining layer including a first pixel defining sub-layer disposed between each two adjacent first electrodes, and a second pixel defining sub-layer covering the first pixel defining sub-layer and surface edge portions of each two adjacent first electrodes, an intermediate layer disposed on each of the first electrodes and including an emission layer, and a second electrode configured to face the first electrodes.

19 Claims, 6 Drawing Sheets

(56) References Cited

U.S. PATENT DOCUMENTS

| | | |
|---|---|---|
| 2005/0110028 A1* | 5/2005 | Park et al. .................. 257/88 |
| 2005/0206309 A1* | 9/2005 | Shibasaki et al. ............ 313/504 |
| 2006/0022587 A1 | 2/2006 | Jeong et al. |
| 2007/0052352 A1* | 3/2007 | Im et al. ..................... 313/506 |
| 2008/0124574 A1 | 5/2008 | Shoda et al. |
| 2010/0078627 A1 | 4/2010 | Yoshinaga |

FOREIGN PATENT DOCUMENTS

| | | |
|---|---|---|
| JP | 2006-267861 | 10/2006 |
| JP | 2008-098148 | 4/2008 |
| JP | 2008-130410 | 6/2008 |
| JP | 2008-234989 | 10/2008 |
| JP | 2008-270118 | 11/2008 |
| JP | 2010-033936 | 2/2010 |
| KR | 1020050049688 | 5/2005 |
| KR | 1020070028122 | 3/2007 |
| KR | 1020070071902 | 7/2007 |
| KR | 1020070106240 | 11/2007 |
| KR | 10-2008-0014328 | 2/2008 |

OTHER PUBLICATIONS

Registration Determination Certificate dated Apr. 25, 2012 in Korean Priority Application No. 10-2010-0043054.

Office Action dated Dec. 24, 2014 in corresponding Japanese Patent Application No. 2011-083645.

* cited by examiner

ORGANIC LIGHT-EMITTING DISPLAY DEVICE AND METHOD OF MANUFACTURING THE ORGANIC LIGHT EMITTING DISPLAY DEVICE

CROSS-REFERENCE TO RELATED APPLICATIONS

This application claims the benefit of Korean Patent Application No. 10-2010-0043054, filed on May 7, 2010, in the Korean Intellectual Property Office, the disclosure of which is incorporated herein in its entirety by reference.

BACKGROUND

1. Field

The present disclosure relates to an organic light-emitting display device in which the thickness of pixels is uniform, and a method of manufacturing the organic light-emitting display device.

2. Description of the Related Technology

An organic light-emitting display device may be classified as either a passive matrix (PM) organic light-emitting display device or an active matrix (AM) organic light-emitting display device according to the driving method thereof. In passive matrix organic light-emitting display devices, anodes are generally arranged in columns, and cathodes are arranged in rows. A row driving circuit applies scanning signals to a group of anodes in units of rows. In addition, a column driving circuit applies a data signal to each pixel. In active matrix organic light-emitting display devices, the input of a signal to each pixel is controlled by a thin film transistor (TFT). Thus, active matrix organic light-emitting display devices are appropriate for processing a large amount of signals, and thus have been used to display moving pictures.

In an active matrix organic light-emitting display device, a passivation layer is typically disposed on TFTs as a protecting layer and a layer for planarizing an upper surface of the TFTs. In addition, pixel defining layers (PDLs) are typically disposed on the passivation layer.

Pixel defining layers are generally formed to a thickness that is large enough to prevent mixing of colors between adjacent pixels, so that the thickness of the pixel emission areas between the pixel defining layers may vary. When the pixel defining layer is formed as an organic layer, outgassing may occur as a result of chemical decomposition over a short or long time duration. The outgas may flow into the pixel emission areas, thereby degrading the organic light-emitting display device, resulting in, for example, pixel shrinkage or reduced lifetime.

SUMMARY OF CERTAIN INVENTIVE ASPECTS

Instant embodiments provide an organic light-emitting display device including pixel emission areas having a uniform thickness, wherein degradation of the pixel emission areas caused by outgassing from pixel defining layers may be prevented, and a method of manufacturing the organic light-emitting display device.

One aspect is an organic light-emitting display device including: a substrate, a plurality of pixels on the substrate, a plurality of first electrodes, each disposed in each of the plurality of pixels, a pixel defining layer including a first pixel defining sub-layer disposed between each two adjacent first electrodes, and a second pixel defining sub-layer covering the first pixel defining sub-layer and surface edge portions of each two adjacent first electrodes, an intermediate layer disposed on each of the first electrodes and including an emission layer, and a second electrode configured to face the first electrodes.

Another aspect is a method of manufacturing an organic light-emitting display device, the method including: forming a first electrode in each pixel on a substrate, forming a first pixel defining sub-layer between each two adjacent first electrodes, forming a second pixel defining sub-layer to cover the first pixel defining sub-layer and surface edge portions of each two adjacent first electrodes, forming an intermediate layer on the first electrode, the intermediate layer including an emission layer, and forming a second electrode facing the first electrodes.

BRIEF DESCRIPTION OF THE DRAWINGS

The above and other features and advantages will become more apparent by describing in detail exemplary embodiments with reference to the attached drawings in which.

DETAILED DESCRIPTION OF CERTAIN INVENTIVE EMBODIMENTS

Hereinafter, instant embodiments will be described more fully with reference to the accompanying drawings. In the drawings, like reference numerals generally denote like elements. In the following description, a detailed description of disclosed functions or structures will not be provided if they are deemed unnecessary and make features of the embodiments obscure.

In the drawings, the thicknesses or sizes of layers or regions may be exaggerated for clarity. It will be understood that, unless otherwise specified, when an element such as a layer, film, region or substrate is referred to as being "on" another element, it can be "directly" on the other element or intervening elements may also be present.

Figure 1:
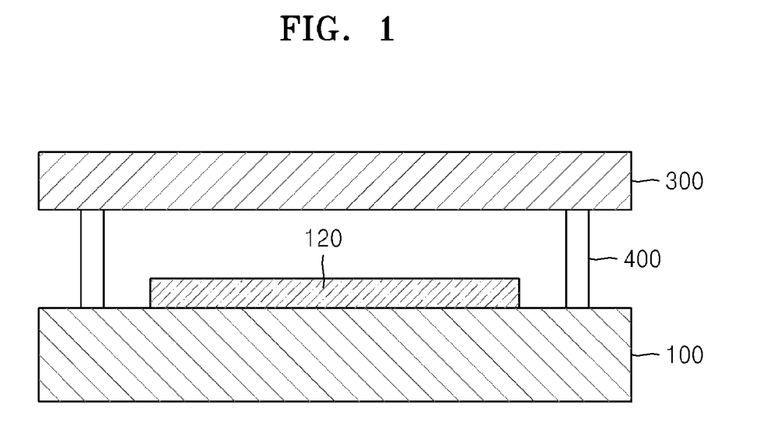
FIG. 1 is a cross-sectional view of an embodiment of an organic light-emitting display device.
Figure 2:
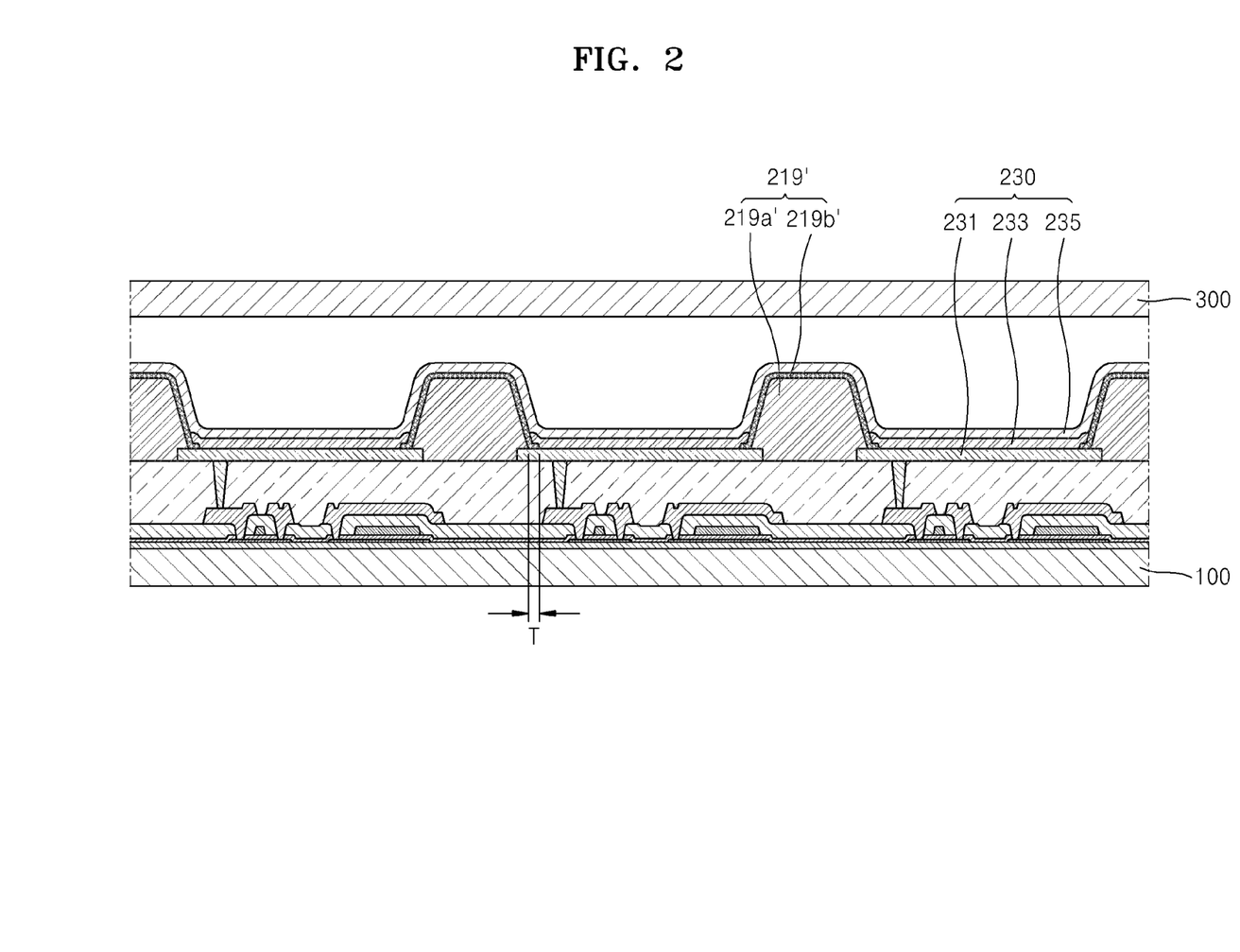
FIG. 2 is a schematic cross-sectional view of an embodiment of the organic light-emitting display device of FIG. 1.

FIG. 1 is a cross-sectional view of an embodiment of an organic light-emitting display device. FIG. 2 is a schematic cross-sectional view of an embodiment of the organic light-emitting display device of FIG. 1.

Referring to FIGS. 1 and 2, an embodiment of the organic light-emitting display device includes a lower substrate 100 on which a display area 120 is disposed, and an encapsulation substrate 300 covering a space above the display area 120. The lower substrate 100 and the encapsulation substrate 300 may be bonded together by using a sealant 400.

In some embodiments, the lower substrate 100 may be a substrate formed of a transparent glass material containing $SiO_2$. In other embodiments, the lower substrate 100 may be any substrate formed of various materials, for example, a transparent plastic, a metal, or the like.

The display area 120 on the lower substrate 100 may include a plurality of pixels 230 and a plurality of thin film transistors (TFTs) 220 electrically connected to the pixels 230.

Each of the pixels 230 includes a first electrode 231, a second electrode 235 disposed opposite to the first electrode 231, and an intermediate layer 233 disposed between the first electrode 231 and the second electrode 235.

A pixel defining layer 219' is disposed between the first electrodes 231 of each two adjacent pixels 230 to define emission areas. Each of the pixel defining layers 219' includes a first pixel defining sub-layer 219a' and a second pixel defining sub-layer 219b'. The first pixel defining sub-layer 219a' is disposed between the first electrodes 231. The second pixel defining sub-layer 219b' is disposed to cover the first pixel defining sub-layer 219a' and surface edge portions of the first electrodes 231.

When an inkjet printing method or a nozzle printing method is used to form organic emission layers, a pixel defining layer between adjacent pixels is generally formed to have a thickness that is large enough to prevent color mixing across the pixels, and is generally surface-treated to repel liquid. When the pixel defining layer has such a large thickness, the thickness of the pixels may also vary between the surface edge portions and the centers thereof. Furthermore, when an electric field is applied to the first electrodes of the pixels, the electric field may be more concentrated at the surface edge portions of the first electrodes, thereby deteriorating the surface edge portions or causing an electrical short between the first and second electrodes. Minimizing the pixel thickness non-uniformity may help prevent such deterioration and electrical shorts.

To this end, in some embodiments, the pixel defining layer 219' has a layered structure including the first pixel defining sub-layer 219a', which is formed as an organic layer, and the second pixel defining sub-layer 219b', which is formed as an inorganic layer.

The first pixel defining sub-layer 219a' may have a thickness of about 0.2 to about 3 μm to planarize the underlying layer and to prevent color mixing across the pixels.

The second pixel defining sub-layer 219b' may be formed of an inorganic layer to be thin. The second pixel defining layer 219b' may have a taper angle that is relatively small. In some embodiments, the second pixel defining layer 219b' may have a taper angle of 45 degrees or less. The second pixel defining layer 219b' may have a thickness of about 0.1 to about 1 μm.

In order to reduce a variation in thickness of the intermediate layer 233, which may occur if the first pixel defining layer 219a' were to have a large thickness, an edge gap T between the first pixel defining sub-layer 219a' and the second pixel defining sub-layer 219b' may be about 1 μm or greater. The edge gap T may vary according to the size of an opening and an effective emission area in the first electrode 231.

In some embodiments, the intermediate layer 233 may be formed as separate patterns to respectively correspond to the pixels 230, as illustrated in FIG. 2. In other embodiments, the intermediate layer 233 may be continuously formed on the entire surface of the substrate 100. The intermediate layer 233 covers an upper surface of the first electrode 231 and contacts the second pixel defining sub-layer 219b' in the surface edge portions of the first electrode 231. The edges of the first pixel defining sub-layer 219a' and the second pixel defining sub-layer 219b' located in the surface edge portions of the first electrode 231 are separated by a predetermined gap. The intermediate layer 233 overlaps the second pixel defining sub-layer 219b', which is formed to be thin. Therefore, a variation in thickness of the intermediate layer 233 between the center and edge portions thereof may be minimized.

In some embodiments, the intermediate layer 233 includes an organic emission layer (EML). In other embodiments, the intermediate layer 233 may further include at least one layer selected from the group consisting of a hole injection layer (HIL), a hole transport layer (HTL), an electron transport layer (ETL), and an electron injection layer (EIL).

The lower substrate 100 with the display area 120 thereon is bonded to the encapsulation substrate 300 by using the sealant 400. The encapsulation substrate 300 may be any substrate formed of various materials. In some embodiments, the encapsulation substrate 300 may be a glass substrate, a plastic substrate, or a metal plate. In some embodiments, a glass frit may be used as the sealant 400.

Figure 3:
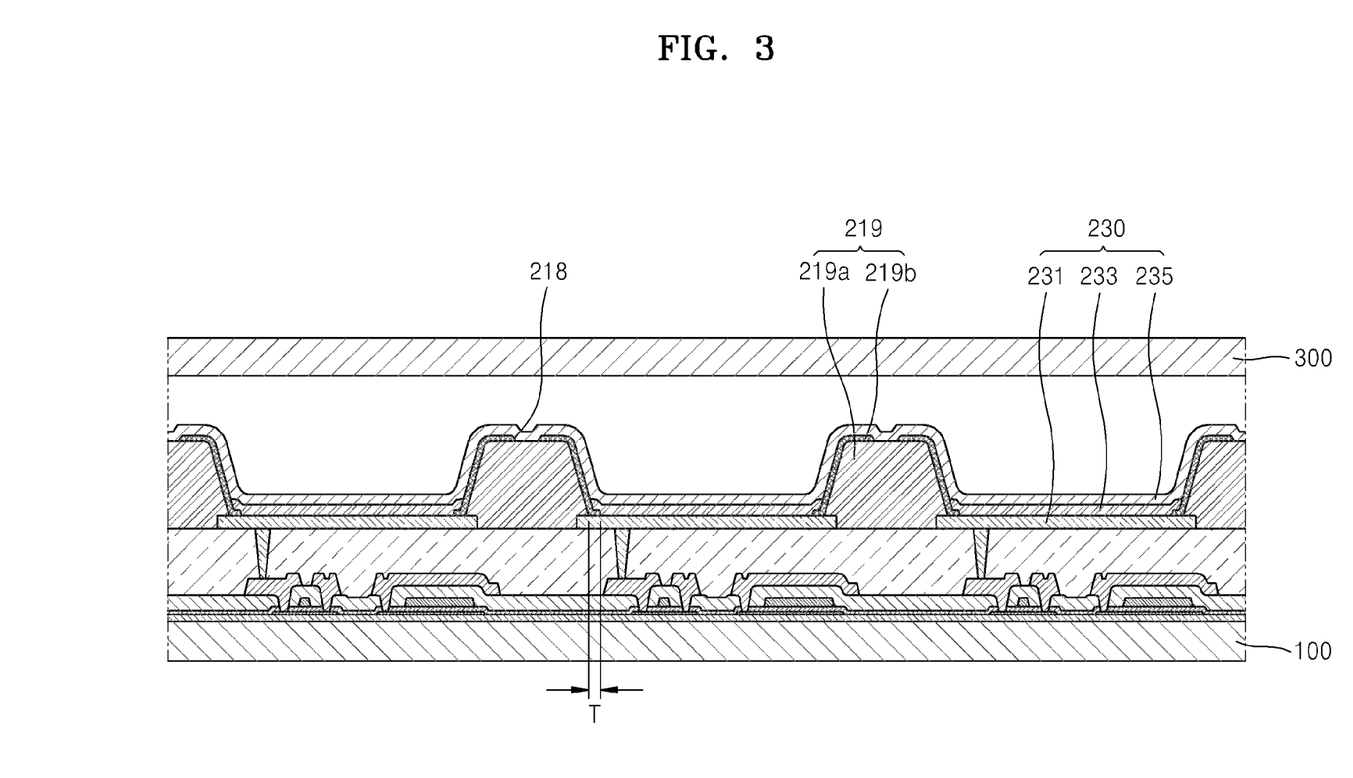
FIG. 3 is a schematic cross-sectional view of another embodiment of the organic light-emitting display device of FIG. 1.

FIG. 3 is a schematic cross-sectional view of another embodiment of the organic light-emitting display device of FIG. 1. The organic light-emitting display device of FIG. 3 has substantially the same structure as the organic light-emitting display device of FIG. 2, except for the structure of the pixel defining layer 219. Thus, a detailed description of the organic light-emitting display device of FIG. 3 will not be repeated here.

Referring to FIG. 3, the pixel defining layer 219 includes a first pixel defining sub-layer 219a, which may be formed as an organic layer, and a second pixel defining sub-layer 219b, which may be formed as an inorganic layer.

The first pixel defining sub-layer 219a may have a thickness of about 0.2 to about 3 μm to planarize the underlying layer and to prevent color mixing across the pixels.

The second pixel defining sub-layer 219b may be formed of an inorganic layer to be thin. The second pixel defining layer 219b may have a taper angle that is relatively small. In some embodiments, the second pixel defining sub-layer 219b may have a taper angle of 45 degrees or less. The second pixel defining sub-layer 219b may have a thickness of about 0.1 to about 1 μm.

In order to eliminate a variation in thickness of the intermediate layer 233, which may occur if the first pixel defining sub-layer 219a were to have a large thickness, an edge gap T between the first pixel defining sub-layer 219a and the second pixel defining sub-layer 219b may be about 1 μm or greater. The edge gap T may vary according to the size of an opening and an effective emission area in the first electrode 231.

In some embodiments, the intermediate layer 233 may be formed as separate patterns to respectively correspond to the pixels 230. In other embodiments, the intermediate layer 233 may be continuously formed on the entire surface of the substrate 100. The intermediate layer 233 covers an upper surface of the first electrode 231 and contacts the second pixel defining sub-layer 219b in the surface edge portions of the first electrode 231. The edges of the first pixel defining sub-layer 219a and the second pixel defining sub-layer 219b located in the surface edge portions of the first electrode 231 are separated by a predetermined gap. The intermediate layer 233 overlaps the second pixel defining sub-layer 219b, which is formed to be thin. Therefore, the variation in thickness of the intermediate layer 233 between the center and edge portions thereof may be minimized.

In the embodiment of FIG. 3, the second pixel defining sub-layer 219b may have an opening 218 for discharging an outgas generated as a result of chemical decomposition over a short or long time duration. Cracks or holes may thus be prevented from occurring in the second pixel defining sub-layer 219b due to outgassing from the first pixel defining sub-layer 219a during a high-temperature thermal treatment in the manufacture of the organic light-emitting display device. The opening 218 of the second pixel defining sub-layer 219b formed in the center thereof facilitates discharging of the outgas generated during the manufacturing process.

Figure 4:
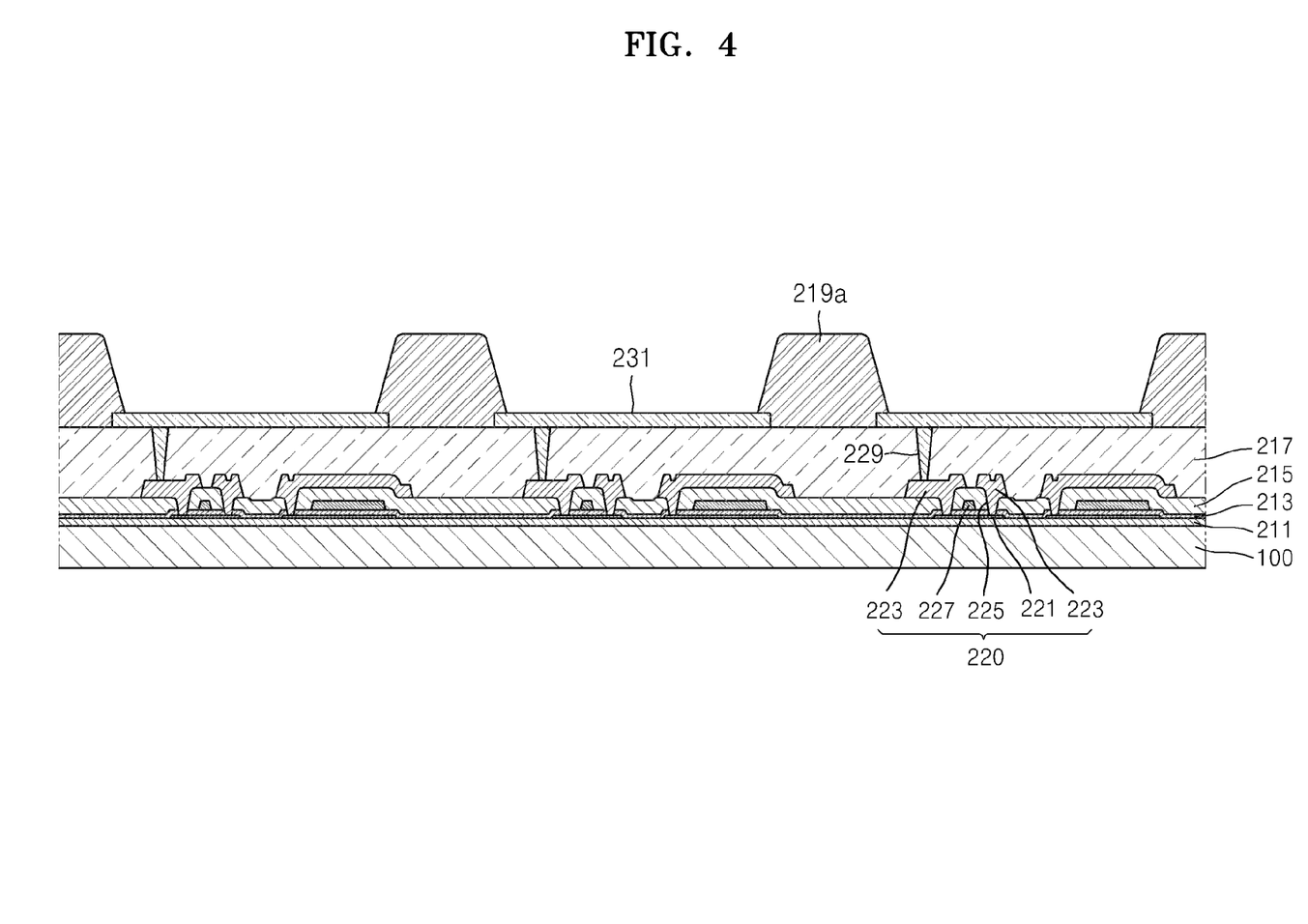
FIGS. 4 through 6 are cross-sectional views for describing an embodiment of a method of forming pixel defining layers of embodiments of an organic light-emitting display device.
Figure 5:
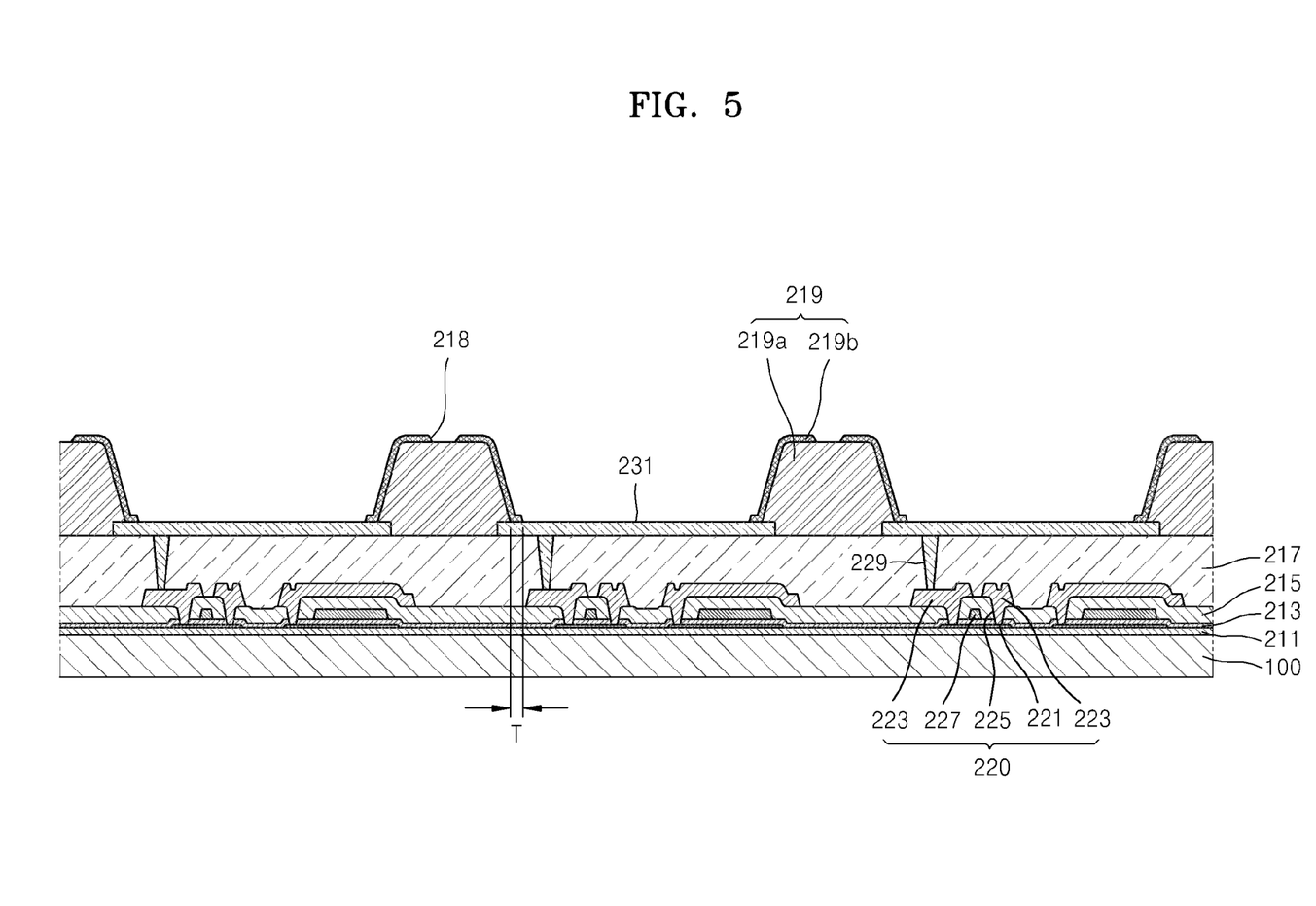
Figure 6:
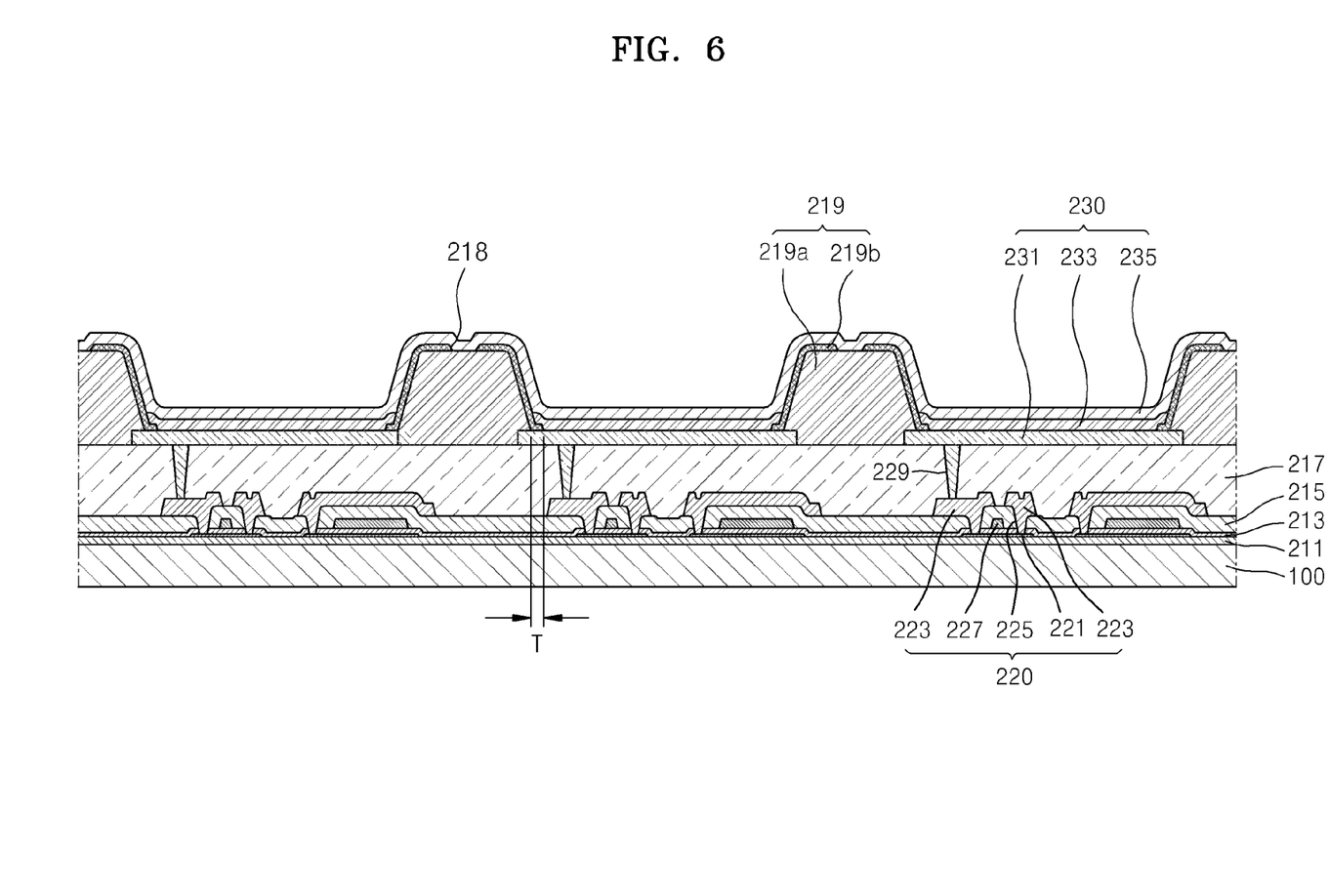

FIGS. 4 through 6 are cross-sectional views for describing an embodiment of a method of forming an embodiment of the pixel defining layer 219 of the organic light-emitting display device.

Referring to FIG. 4, the first electrodes 231 to be electrically connected to the TFTs 220 are formed on the lower substrate 100 having the TFTs 220. The first pixel defining sub-layer 219a is formed between each two adjacent first electrodes 231.

In bottom-emission embodiments of the organic light-emitting display device, which display an image toward the lower substrate 100, the lower substrate 100 may be formed of a transparent material. In top-emission embodiments of the organic light-emitting display device, which display an image in a direction opposite to the lower substrate 100, the lower substrate 100 may be formed of a non-transparent material. In some top-emission embodiments, the lower substrate 100 may be formed of a metal. The metal may include at least one material selected from the group consisting of carbon (C), iron (Fe), chrome (Cr), manganese (Mn), nickel (Ni), titanium (Ti), molybdenum (Mo), stainless steel (SUS), an Invar alloy, an Inconel alloy, and a Kovar alloy. In other top-emission embodiments, the lower substrate 100 may be formed of a metal foil.

In some embodiments, an insulating layer 211, such as for example, a barrier layer and/or a buffer layer, may be formed on an upper surface of the lower substrate 100 to prevent diffusion of impurity ions and penetration of moisture or external air and to planarize the upper surface of the lower substrate 100.

The TFTs 220 are formed on the insulating layer 211 as driving circuits. In some embodiments, top-gate TFTs may be used. TFTs having any of various structures may be used in various embodiments.

An active layer 221 for the TFTs 220 is formed of a semiconductor material on the insulating layer 211. A gate insulating layer 213 is formed to cover the active layer 221. The active layer 221 may be formed of an inorganic semiconductor material, such as amorphous silicon or polysilicon, or an organic semiconductor material. The active layer 221 includes a source region, a drain region, and a channel region between the source and drain regions.

A gate electrode 227 is formed on the gate insulating layer 213. An interlayer insulating layer 215 is formed to cover the gate electrode 227. Source and drain electrodes 223 are formed on the interlayer insulating layer 215 to be connected to the active layer 221 through a contact hole 225. A planarization layer 217 is formed to cover the source and drain electrodes 223.

The stack structure of the TFTs 220 is not limited to the above embodiments. Any of various TFT structures may be used in various embodiments.

The first electrode 231 is formed in each of the pixels 230 on the planarization layer 217. The first electrode 231 is electrically connected to one of the source and drain electrodes 223 through a via hole 229.

The first electrode 231 may function as an anode or a cathode. The first electrode 231 may be formed as a transparent electrode or a reflective electrode. In embodiments where the first electrode 231 is formed as a transparent electrode, the first electrode 231 may be formed of a material selected from the group consisting of indium tin oxide (ITO), indium zinc oxide (IZO), zinc oxide (ZnO), and indium oxide ($In_2O_3$). In embodiments where the first electrode 231 is formed as a reflective electrode, the first electrode 231 may include a reflective layer that is formed of a material selected from the group consisting of silver (Ag), magnesium (Mg), aluminum (Al), platinum (Pt), palladium (Pd), gold (Au), nickel (Ni), neodymium (Nd), iridium (Ir), chromium (Cr), and a combination thereof, and a transparent layer that is formed of a material selected from the group consisting of ITO, IZO, ZnO, and $In_2O_3$.

The first electrode 231 may be formed by forming an electrode layer and patterning the electrode layer by carrying out a series of photolithography processes, including coating with photoresist, exposure, developing, etching, and removing the photoresist.

Still referring to FIG. 4, the first pixel defining sub-layer 219a is formed between each two adjacent first electrodes 231 to contact the sides and edge portions of the first electrodes 231.

The first pixel defining sub-layer 219a may be formed of a material having excellent outgassing ability and insulating characteristics. In some embodiments, the first pixel defining sub-layer 219a may be formed of an organic material selected from the group consisting of polyacryl, polyimide, polyamide (PA), benzocyclobutene (BCB) and phenolic resin.

In some embodiments, the first pixel defining sub-layer 219a may be formed by forming a layer by using a coating method, such as, for example, spin coating, or slot coating, and patterning the layer by carrying out a photolithography process, to expose the first layer 231. In other embodiments, an inkjet patterning method may be used to form the first pixel defining sub-layer 219a.

As illustrated in the embodiment of FIG. 4, the first pixel defining sub-layer 219a may be formed to cover the side edges and the surface edge portions of the first electrodes 231. In other embodiments, the first pixel defining sub-layer 219a may be formed to contact the side edges of the first electrodes 231 or to be away from the side edges of the first electrodes 231 by several micrometers. The first pixel defining sub-layer 219a may be formed in such a way as to expose the surfaces of the first electrodes 231 by as much as possible.

In some embodiments, the first pixel defining sub-layer 219a may have a thickness of about 0.2 to about 3 μm.

Referring to FIG. 5, the second pixel defining sub-layer 219b is formed on an upper surface of the first pixel defining sub-layer 219a.

The second pixel defining sub-layer 219b may be formed of an inorganic material having insulating characteristics, such as, for example, a material selected from the group consisting of $SiO_2$, $SiN_x$, $Al_2O_3$, $CuO_x$, $Tb_4O_7$, $Y_2O_3$, $Nb_2O_5$, and $Pr_2O_3$.

The second pixel defining sub-layer 219b may be formed by forming a layer covering the first electrodes 231 and the first pixel defining sub-layer 219a by using a sputtering method, a chemical vapor deposition (CVD) method, or a deposition method, and patterning the layer by carrying out a photolithography process to expose the first electrodes 231. The second pixel defining sub-layer 219b may be formed in such a way as to expose the surfaces of the first electrodes 231 by as much as possible to increase the aperture ratio of the organic light-emitting display device.

The second pixel defining sub-layer 219b may have a taper angle that is relatively small. The second pixel defining sub-layer 219b may be formed as thin as possible. In some embodiments, to the second pixel defining sub-layer 219b may have a thickness of about 0.1 μm to about 1 μm.

In order to eliminate any variation in thickness of the intermediate layer 233, an edge gap T between the first pixel defining sub-layer 219a and the second pixel defining sub-layer 219b may be about 1 μm or greater in some embodiments.

The edges of the first pixel defining sub-layer 219a and the second pixel defining sub-layer 219b located in the surface edge portions of the first electrode 231 are separated by a predetermined gap. The intermediate layer 233 overlaps the second pixel defining sub-layer 219b, which is formed to be thin. Therefore, the variation in thickness of the intermediate layer 233 disposed on the first electrode 231 may be minimized, and the intermediate layer 233 may be planarized. A short in the organic emission layer caused due to a variation in thickness may be prevented, and the binding force between the first electrode 231 and the intermediate layer 233 may be enhanced.

Still referring to FIG. 5, the second pixel defining sub-layer 219b may have an opening 218. The opening 218 may be formed in the center of the second pixel defining sub-layer 219b to facilitate the discharging of an outgas generated from the first pixel defining sub-layer 219a during a high-temperature process. The discharge of the outgas helps prevent damage to the second pixel defining sub-layer 219b.

In some embodiments, the opening 218 of the second pixel defining sub-layer 219b may be formed by carrying out a photolithography process or by using a fine metal mask (FMM).

In embodiments without an opening 218, the intermediate layer 233 may be formed on the first electrode 231 after the second pixel defining sub-layer 219b is formed.

Referring to FIG. 6, the intermediate layer 233 including the organic EML is formed on the surface of the first electrode 231, and the second electrode 235 is then formed on the intermediate layer 233 and the second pixel defining sub-layer 219b.

The intermediate layer 233 may be formed of a low-molecular weight organic material or an organic polymer material having a large molecular weight. In embodiments where the intermediate layer 233 is formed of a low-molecular weight organic material, the intermediate layer 233 may have a stacked structure including at least one layer selected from the group consisting of a hole injection layer (HIL), a hole transport layer (HTL), an emission layer (EML), an electron transport layer (ETL), and an electron injection layer (EIL). In some embodiments, the low-molecular weight organic material may include copper phthalocyanine (CuPc), N,N'-Di(naphthalene-1-yl)-N,N'-diphenyl-benzidine (NPB), tris-8-hydroxyquinoline aluminum (Alq3), and the like. Such a low-molecular weight organic material may be deposited using a vacuum deposition method with a mask to cover the entire surface of the substrate 100 or as separate patterns respectively corresponding to the pixels 230.

In embodiments where the intermediate layer 233 is formed of a high-molecular weight organic material, the intermediate layer 233 may have a structure including a HTL and EML. The HTL may be formed of poly(ethylenedioxythiophene) (PEDOT), and the EML may be formed of polyphenylenevinylenes (PPVs) or polyfluorenes.

The second electrode 235 is located opposite to the first electrode 231. The second electrode 235 may function as a cathode or an anode. The second electrode 235 may be formed on the entire surface of the substrate 100 by using a deposition method to function as a common electrode for all the pixels 230.

The second electrode 235 may be formed as a transparent electrode or a reflective electrode. In embodiments where the second electrode 235 is formed as a transparent electrode, the second electrode 235 may include a layer formed of a material selected from the group consisting of lithium (Li), calcium (Ca), lithium fluoride/calcium (LiF/Ca), lithium fluoride/aluminum (LiF/Al), aluminum (Al), silver (Ag), magnesium (Mg), and a combination thereof on the intermediate layer 233, and an auxiliary electrode or a bus electrode line formed of a transparent conductive material selected from the group consisting of ITO, IZO, ZnO, and $In_2O_3$ on the layer. In embodiments where the second electrode 235 is formed as a reflective electrode, the second electrode 235 may be formed of a material selected from the group consisting of Li, Ca, LiF/Ca, LiF/Al, Al, Ag, Mg, and a combination thereof.

The lower substrate 100 with the structure formed as described above is bonded to the encapsulation substrate 300, thereby completing the manufacture of the organic light-emitting display device. The encapsulation substrate 300 may be formed of glass, a plastic, or a conductive metal.

Although the embodiments were described above with reference to active matrix light-emitting display devices, any of various display devices including a pixel defining layer, for example, passive matrix organic light-emitting display devices may also be formed.

According to the instant embodiments, a pixel defining layer includes an organic pixel defining sub-layer and an inorganic pixel defining sub-layer that is formed to be thin on the organic pixel defining sub-layer. A pixel emission area may have a uniform thickness even though it overlaps a surface edge portion of the inorganic pixel defining sub-layer.

According to the instant embodiments, an outgas generated from the organic pixel defining sub-layer may be easily discharged, thus preventing damage to the inorganic pixel defining sub-layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device comprising:
a substrate;
a plurality of pixels on the substrate;
a plurality of first electrodes, each first electrode disposed in each pixel of the plurality of pixels and contacting a planarization layer;
a pixel defining layer comprising a first pixel defining sub-layer disposed between each two adjacent first electrodes, and a second pixel defining sub-layer covering the first pixel defining sub-layer and surface edge portions of each two adjacent first electrodes, wherein the first pixel defining sub-layer contacts the planarization layer and wherein the second pixel defining sub-layer comprises an opening in a center of the second pixel defining sub-layer;
an intermediate layer disposed on each of the first electrodes and comprising an emission layer; and
a second electrode configured to face the plurality of first electrodes wherein the second electrode contacts the first pixel defining sub-layer through the opening, and the second electrode has a substantially uniform thickness.

2. The organic light-emitting display device of claim 1, wherein the first pixel defining sub-layer is an organic layer.

3. The organic light-emitting display device of claim 1, wherein the first pixel defining sub-layer comprises at least one material selected from the group consisting of polyacryl, polyimide, polyamide (PA), benzocyclobutene (BCB) and a phenolic resin.

4. The organic light-emitting display device of claim 1, wherein the first pixel defining sub-layer has a thickness of about 0.2 to about 3 μm.

5. The organic light-emitting display device of claim 1, wherein the second pixel defining sub-layer is an inorganic layer.

6. The organic light-emitting display device of claim 1, wherein the second pixel defining sub-layer comprises at least one material selected from the group consisting of SiO2, SiNx, Al2O3, CuOx, Tb4O7, Y2O3, Nb2O5, and Pr2O3.

7. The organic light-emitting display device of claim 1, wherein the second pixel defining sub-layer has a thickness of about 0.1 to about 1 μm.

8. A method of manufacturing an organic light-emitting display device according to claim 1, the method comprising:
  forming the plurality of first electrodes with each first electrode disposed in each pixel on the substrate;
  forming the first pixel defining sub-layer between each two adjacent first electrodes;
  forming the second pixel defining sub-layer to cover the first pixel defining sub-layer and surface edge portions of each two adjacent first electrodes;
  forming the intermediate layer on the first electrode, the intermediate layer comprising the emission layer; and
  forming the second electrode facing the plurality of first electrodes.

9. The method of claim 8, further comprising forming the opening in a center of the second pixel defining sub-layer.

10. The method of claim 9, wherein the opening is formed using a photolithography process.

11. The method of claim 8, wherein the first pixel defining sub-layer is formed as an organic layer.

12. The method of claim 8, wherein the first pixel defining sub-layer is formed of at least one material selected from the group consisting of polyacryl, polyimide, polyamide (PA), benzocyclobutene (BCB) and a phenolic resin.

13. The method of claim 8, wherein the first pixel defining sub-layer has a thickness of about 0.2 to about 3 μm.

14. The method of claim 8, wherein the second pixel defining sub-layer is formed as an inorganic layer.

15. The method of claim 8, wherein the second pixel defining sub-layer is formed of at least one material selected from the group consisting of SiO2, SiNx, Al2O3, CuOx, Tb4O7, Y2O3, Nb2O5, and Pr2O3.

16. The method of claim 9, wherein the second pixel defining sub-layer has a thickness of about 0.1 to about 1 μm.

17. An organic light-emitting display device comprising:
  a substrate;
  a plurality of pixels on the substrate;
  a plurality of first electrodes, each first electrode disposed in each pixel of the plurality of pixels and contacting a planarization layer;
  a pixel defining layer comprising:
    an organic pixel defining sub-layer disposed between each two adjacent first electrodes, wherein the organic pixel defining sub-layer contacts the planarization layer; and
    an inorganic pixel defining sub-layer covering the organic pixel defining sub-layer and surface edge portions of each two adjacent first electrodes, wherein the inorganic pixel defining sub-layer is configured to discharge an outgas generated from the organic pixel defining sub-layer through an opening in a center of the inorganic pixel defining sub-layer;
  an intermediate layer disposed on each of the first electrodes and comprising an emission layer; and
  a second electrode configured to face the first electrodes wherein the second electrode contacts the first pixel defining sub-layer through the opening, and the second electrode has a substantially uniform thickness.

18. The organic light-emitting display device of claim 17, wherein the organic pixel defining sub-layer has a thickness of about 0.2 to about 3 μm.

19. The organic light-emitting display device of claim 17, wherein the inorganic pixel defining sub-layer has a thickness of about 0.1 to about 1 μm.

* * * * *